United States Patent
Tao et al.

(10) Patent No.: US 10,153,341 B2
(45) Date of Patent: Dec. 11, 2018

(54) METHOD OF FORMING INTERNAL SPACER FOR NANOWIRES

(71) Applicant: IMEC VZW, Leuven (BE)

(72) Inventors: Zheng Tao, Heverlee (BE); Boon Teik Chan, Leuven (BE); Soon Aik Chew, Heverlee (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 15/822,275

(22) Filed: Nov. 27, 2017

(65) Prior Publication Data
US 2018/0166534 A1    Jun. 14, 2018

(30) Foreign Application Priority Data
Dec. 9, 2016    (EP) .................... 16203211

(51) Int. Cl.
*H01L 29/06*      (2006.01)
*H01L 21/3065*   (2006.01)
(Continued)

(52) U.S. Cl.
CPC .......... *H01L 29/0673* (2013.01); *B82Y 10/00* (2013.01); *H01L 21/0217* (2013.01); *H01L 21/02126* (2013.01); *H01L 21/02532* (2013.01); *H01L 21/3065* (2013.01); *H01L 29/0847* (2013.01); *H01L 29/42392* (2013.01); *H01L 29/66* (2013.01); *H01L 29/6653* (2013.01); *H01L 29/6656* (2013.01); *H01L 29/66545* (2013.01); *H01L 29/66553* (2013.01); *H01L 29/66742* (2013.01); *H01L 21/02271* (2013.01); *H01L 21/02282* (2013.01)

(58) Field of Classification Search
None
See application file for complete search history.

(56) References Cited

U.S. PATENT DOCUMENTS

| 2014/0001441 A1 | 1/2014 | Kim et al. |
| 2014/0042386 A1 | 2/2014 | Cea et al. |

(Continued)

FOREIGN PATENT DOCUMENTS

| WO | 2015/050546 A1 | 4/2015 |
| WO | 2015/147792 A1 | 10/2015 |

*Primary Examiner* — Angel Roman
(74) *Attorney, Agent, or Firm* — McDonnell Boehnen Hulbert & Berghoff LLP (57) ABSTRACT

A method of forming a semiconductor device comprising horizontal nanowires is described. An example method involves providing a semiconductor structure comprising at least one fin, where the fin includes an alternating stack of layers of sacrificial material and nanowire material, and where the semiconductor structure includes a dummy gate partly covering the stack of layers. The method further involves at least partly removing the sacrificial material, in between the layers of nanowire material, next to the dummy gate thereby forming a void. Still further, the method involves providing spacer material within the void thereby forming an internal spacer. Yet still further the method involves removing the dummy gate, and selectively removing the sacrificial material in that part of the fin which was covered by the dummy gate, thereby releasing the nanowires. The internal spacer is provided before removing the dummy gate and the sacrificial material to release the nanowires.

18 Claims, 10 Drawing Sheets

(51) Int. Cl.
*H01L 29/66* (2006.01)
*H01L 29/423* (2006.01)
*H01L 29/08* (2006.01)
*H01L 21/02* (2006.01)
*B82Y 10/00* (2011.01)

(56) References Cited

U.S. PATENT DOCUMENTS

| | | | |
|---|---|---|---|
| 2016/0027870 A1* | 1/2016 | Cheng | H01L 29/0673 |
| | | | 257/347 |
| 2016/0211322 A1* | 7/2016 | Kim | H01L 29/66795 |
| 2017/0069734 A1* | 3/2017 | Doris | H01L 21/0228 |
| 2017/0154973 A1* | 6/2017 | Ching | H01L 29/41791 |
| 2017/0194213 A1* | 7/2017 | Ching | H01L 21/823821 |
| 2017/0358665 A1* | 12/2017 | Song | H01L 29/66795 |

* cited by examiner

METHOD OF FORMING INTERNAL SPACER FOR NANOWIRES

CROSS-REFERENCE TO RELATED APPLICATIONS

The present application is a non-provisional patent application claiming priority to EP Patent Application No. 16203211.4, filed Dec. 9, 2016, the contents of which are hereby incorporated by reference.

FIELD OF THE DISCLOSURE

The disclosure relates to the field of nanowire semiconductor devices. More specifically, the disclosure relates to a method of forming a semiconductor device comprising horizontal nanowires.

BACKGROUND

The formation of stacked nanowires is an important step for decreasing the feature sizes of semiconductor devices.

One issue which has to be tackled is to reduce the parasitic capacitance due to overlap between the gate and source-drain region of a transistor.

In order to minimize this parasitic capacitance, the formation of an internal spacer may be an integral part of the nanowire integration scheme.

Forming the internal spacer adds additional requirements to the methods for forming a semiconductor device comprising horizontal nanowires. There is therefore room for improvement in the existing methods for forming such semiconductor devices.

SUMMARY

An object of embodiments of the present disclosure is to provide an improved method of forming a semiconductor device comprising horizontal nanowires.

The above objective is accomplished by methods and devices according to the present disclosure.

Embodiments of the present disclosure relate to a method of forming a semiconductor device comprising horizontal nanowires, the method comprising:
  providing a semiconductor structure comprising at least one fin, the at least one fin comprising a stack of layers of sacrificial material alternated with layers of nanowire material, the semiconductor structure comprising a dummy gate partly covering the stack of layers of the at least one fin,
  at least partly removing the sacrificial material, in between the layers of nanowire material, next to the dummy gate thereby forming a void,
  providing spacer material within the void thereby forming an internal spacer,
  removing the dummy gate,
  selectively removing the sacrificial material in that part of the fin which was covered by the dummy gate, thereby releasing the nanowires,
  wherein the sacrificial material, in between the layers of nanowire material, next to the dummy gate is removed and the internal spacer is provided before removing the dummy gate and the sacrificial material so as to release the nanowires.

In example embodiments, the sacrificial material in between the layers of nanowire material and next to the dummy gate is at least partly removed and the internal spacers are formed before removing the dummy gate and the sacrificial material to release the nanowires. In an example, the internal spacer forms an etch stop layer when releasing the nanowires at the dummy gate region. Thereby it is prevented that etching is done under the gate spacer. Example embodiments of the present disclosure are applicable to different nanowire device architectures. Examples thereof are Si, SiGe, Ge, or III/V nanowire integration schemes. In example embodiments, the method steps can be integrated in the gate all around nanowire process flow. In example embodiments, no nanowire material at the dummy gate region will be exposed to etch plasma inside the gate during the internal spacer formation. Before removing the dummy gate, a CMP or etch back step may be done to remove excess material which was added when providing the spacer material (e.g., during the internal spacer deposition of filling). In example embodiments, the over-etching time for releasing the nanowires in the gate region is not limited by the risk of under-cutting in the sacrificial material. The reason therefore being that the internal spacers are already present. This is particularly applicable in fin structures which are tapered. For such fin structures the nanowires at the top have a narrow width and the nanowires at the bottom are wider due to the fin taper profile. As a consequence, it may be required to extend the over-etching time in order to fully release the nanowires at the bottom. Without the presence of the internal spacer, during the longer over-etching time, under-cutting in sacrificial material especially at the top of the nanowires will be severe compared to the bottom. In example embodiments, by having an internal spacer prior to selective removal of the sacrificial material in the dummy gate region, undercut can be eliminated. In example embodiments, the eventual gate length for the different nanowires may only be dependent on the position of the internal spacers. Whereas in existing methods the etching to release the nanowires is time limited and therefore may result in gate lengths which are dependent on the location (etching faster at a higher location than at a lower location due to loading effects). Since the etching time for releasing the nanowires is not limited, it is possible to etch deeper in the material. Therefore, it is possible to release more than two, more than three, or even more than four nanowires.

In embodiments of the present disclosure, the provided semiconductor structure additionally comprises a dummy gate spacer next to the dummy gate, and an inter-level dielectric (ILD) next to the dummy gate spacer such that the dummy gate spacer is in between the dummy gate and the ILD. In embodiments of the present disclosure, the method comprises:
  removing the dummy gate spacer thereby forming a trench, before at least partly removing the sacrificial material next to the dummy gate,
  wherein the removing of the sacrificial material is started from an opening which is formed by the trench,
  wherein providing the spacer material additionally comprises providing spacer material in the trench thereby forming the internal spacer next to the dummy gate.

In embodiments of the present disclosure, an interlayer dielectric may be formed over the source or drain region. In example embodiments, the sacrificial material is removed starting from the trench where the dummy gate spacer is removed. In embodiments of the present disclosure, etching is done from top (the opening formed by the trench) to bottom. In example embodiments, by controlling the CD of the dummy gate spacer (more specifically, the trench through which it is possible to remove the sacrificial material) it is possible to control the removal of that sacrificial material and therefore also the eventual length of the internal spacer. Hence, by selecting the gate spacer CD, it is possible to obtain the wanted dimensions of the internal spacer, taking into account that under-etching will take place. Moreover, when etching in a more narrow space, also the etching will be less isotropic.

In embodiments of the present disclosure, the method comprises:
- depositing gate dielectric material around the nanowires, and
- depositing gate material around the gate dielectric material thereby forming a gate.

In embodiments of the present disclosure, the gate material may be a metal. In example embodiments, the obtained gate stack is aligned by the internal spacers (i.e., the gate shape is secured by depositing the internal spacer first). When removing the sacrificial layers, the removal is stopped at the internal spacer. This method, as opposed to existing methods, where the nanowires at the dummy gate region are released first (before providing the internal spacers). When etching to release the nanowires at the dummy gate region, the removal of the sacrificial material is not stopped if the internal spacers are not present, which may lead to an undercut. When in these existing methods the metal gate is placed (also on the position of the undercut), it cannot be etched away to put the internal spacer. This may therefore result in an even smaller internal spacer. In example embodiments, the deposition of the gate dielectric and of the gate material is delimited by the internal spacer. As the internal spacer is aligned for the different nanowires in embodiments of the present disclosure, this implies that nanowires with a fixed gate length can be achieved.

In embodiments of the present disclosure, depositing the spacer material comprises filling the spacer material bottom up.

In embodiments of the present disclosure, depositing the spacer material comprises a first step wherein a first material is filled bottom up, and a second step comprising a continuous fill with a second material.

In embodiments of the present disclosure, the first material is FCVD oxide (flowable CVD), and the second material is SiN. The first and/or second material may be a spin on metal oxide. In embodiments of the present disclosure, an excess of the first and/or second material may be removed using CMP. In example embodiments, the second material can be selectively removed in a later process step thereby forming an air gap spacer next to the gate. In example embodiments, by using an air gap spacer, a lower K value can be obtained, resulting in a lower total RC delay. In example embodiments, having an air gap spacer next to the gate is suitable for low power applications.

In embodiments of the present disclosure, depositing the spacer material comprises refilling the void and/or the trench with a liner, FCVD (flowable CVD) oxide or spin on material.

In embodiments of the present disclosure, the spacer material may be deposited using a bottom up fill or using a selective deposition.

In embodiments of the present disclosure, removing part of the layers of sacrificial material to form the void is done by isotropic etching.

In embodiments of the present disclosure, the isotropic etching may be done by vapor HCl or by 2-step cyclic plasma etch.

In embodiments of the present disclosure, the method comprises a step wherein a source is formed at one side of the nanowire material next to the dummy gate or gate and a drain is formed at an opposite end of the nanowire material at the opposite side of the dummy gate or gate.

In embodiments of the present disclosure, providing the semiconductor structure comprises depositing a stack of layers on a substrate, the stack of layers comprising layers of sacrificial material alternated with layers of nanowire material and forming at least one fin in the stack.

In embodiments of the present disclosure, depositing the stack comprises depositing at least two layers of nanowire material.

In embodiments of the present disclosure, depositing the stack comprises depositing at least three layers of nanowire material.

In embodiments of the present disclosure, depositing the stack comprises depositing layers of nanowire material which comprise Silicon, or SiGe, or Ge, or InGaAs, or III-V material.

In embodiments of the present disclosure, depositing the stack comprises depositing Ge nanowire material layers and SiGe sacrificial material layers.

In embodiments of the present disclosure, depositing the stack comprises depositing Si nanowire material layers and SiGe sacrificial material layers.

In embodiments of the present disclosure, depositing the spacer material comprises depositing silicon nitride, and/or oxygen-doped silicon carbide (SiC:O), and/or an FCVD oxide, and/or SiN.

In example embodiments, the internal spacer serves as an etch stop layer during the selective removal of the sacrificial material during nanowires release. In embodiments of the present disclosure, this internal spacer material is dielectric material, which has high etch selectivity toward Si or SiGe during sacrificial material etch.

In example embodiments, the formed semiconductor devices are gate all around transistors with a horizontal channel. The channel materials may be Si for both nMOS and pMOS or Si for nMOS and Ge for pMOS. For nMOS, the stack of layers may be a Si/SiGe stack. The Si nanowire may be created by selectively removing SiGe. For pMOS the stack of layers may be a Ge/SiGe stack. The Ge nanowire may be created by selectively removing SiGe. In these examples, for both cases SiGe can be removed selectively.

Example aspects of the disclosure are set out in the accompanying independent and dependent claims. Features from the dependent claims may be combined with features of the independent claims and with features of other dependent claims as appropriate and not merely as explicitly set out in the claims.

These and other aspects of the disclosure will be apparent from and elucidated with reference to the embodiment(s) described hereinafter.

BRIEF DESCRIPTION OF THE FIGURES

The above, as well as additional, features will be better understood through the following illustrative and non-limiting detailed description of example embodiments, with reference to the appended drawings. In the different drawings, the same reference signs refer to the same or analogous elements.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

The drawings described are only schematic and are non-limiting. In the drawings, the size of some of the elements may be exaggerated and not drawn on scale for illustrative purposes. The dimensions and the relative dimensions may not correspond to actual reductions to practice of embodiments of the present disclosure.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of example embodiments of the disclosure, various features of the disclosure are sometimes grouped together in a single embodiment, figure, or description thereof for the purpose of streamlining the disclosure and aiding in the understanding of one or more of the various inventive aspects.

Furthermore, while some embodiments described herein include some but not other features included in other embodiments, combinations of features of different embodiments are meant to be within the scope of the disclosure, and form different embodiments, as would be understood by those in the art.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

Where in embodiments of the present disclosure reference is made to the nanowire material, reference is made to material from which the nanowires are made.

Figure 19:
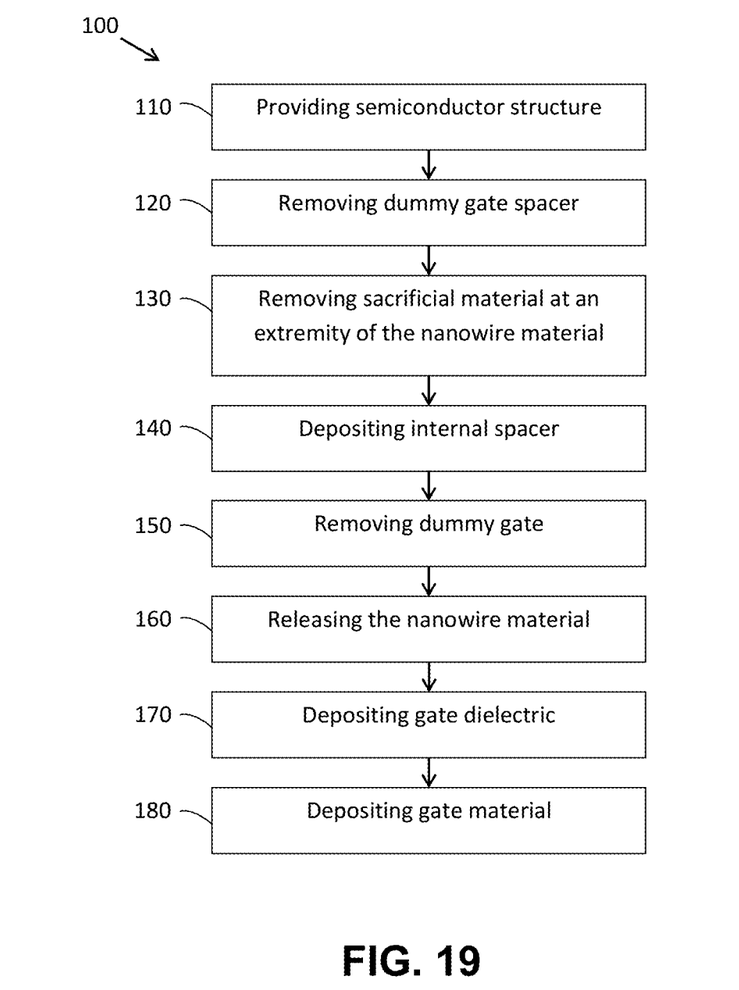
FIG. 19 shows a flow chart of a method, according to an example embodiment.

Embodiments of the present disclosure relate to a method 100 of forming a semiconductor device comprising horizontal nanowires. The method comprises a step 110 for providing a semiconductor structure comprising at least one fin, the at least one fin comprising a stack of layers of sacrificial material 4 alternated with layers of nanowire material 3, the semiconductor structure comprising a dummy gate 7 partly covering the stack of layers of the at least one fin. The layers of nanowire material 3 may for example be epitaxial silicon layers. The layers of sacrificial material 4 may, for example, be epitaxial SiGe layers. The dummy gate 7 may, for example, be a dummy polysilicon gate.

The method moreover comprises a step 130 for at least partly removing the sacrificial material 4, in between the layers of nanowire material 3, next to the dummy gate 7 thereby forming a void 14. In embodiments of the present disclosure, the void corresponds with the openings between the layers of nanowire material resulting from removing the sacrificial material in between the layers of the nanowire material. Partial removal of the sacrificial material next to the dummy gate may be done by selective etching between the sacrificial material 4 and the nanowire material 3.

Isotropic etching either with plasma or wet etching may be applied. The isotropic etching will consume part of the sacrificial layer next to the dummy gate.

In embodiments of the present disclosure, also part of the nanowire material next to the dummy gate may be removed in this removal step 130, when forming the void 14.

The method moreover comprises, at block 140, providing spacer material within the void 14 thereby forming an internal spacer 15.

The method moreover comprises, at block 150, removing the dummy gate 7 (before removing the dummy gate, excess spacer material may be removed), and, at block 160, selectively removing the sacrificial material 4 in that part of the fin which was covered by the dummy gate, thereby releasing the nanowires. In an example, these steps for releasing the nanowires are only performed after forming the internal spacer.

In embodiments of the present disclosure, the provided semiconductor structure additionally comprises a dummy gate spacer 1 next to the dummy gate 7, and an ILD (inter-level dielectric) 6 next to the dummy gate spacer 1 such that the dummy gate spacer 1 is in between the dummy gate 7 and the ILD 6. The ILD may for example be a silicon oxide (e.g. $SiO_2$), SiN, oxygen-doped silicon carbide (SiC:O), or a spin on dielectric. In some embodiments, a carbon content of the SiC:O could be about 15%, however, other percentages of carbon content are possible and contemplated. In embodiments of the present disclosure, the dummy gate spacer 1 is a silicon nitride (e.g. $Si_3N_4$).

Figure 1:
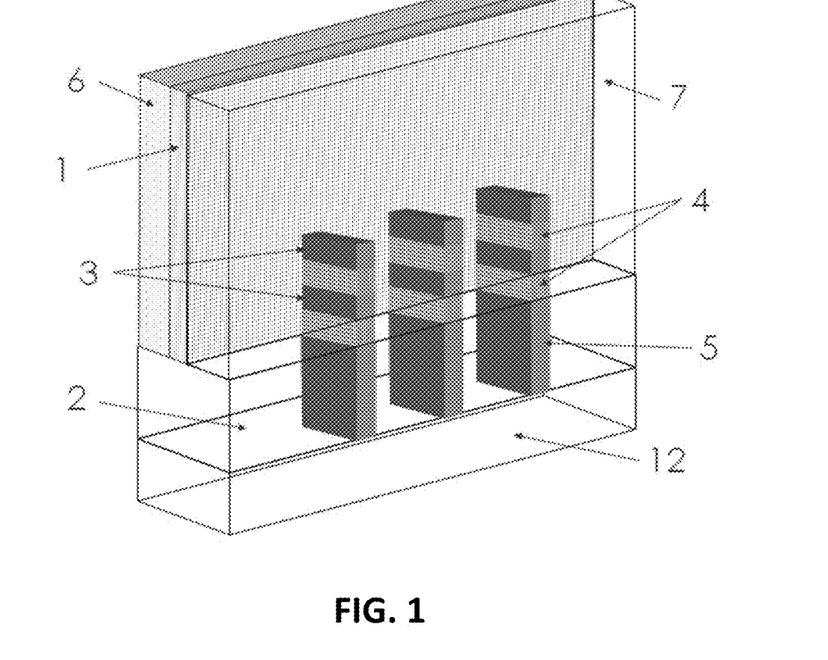
FIG. 1 shows a schematic 3D-drawing of an example semiconductor structure provided by a method in accordance with an example embodiment.
Figure 2:
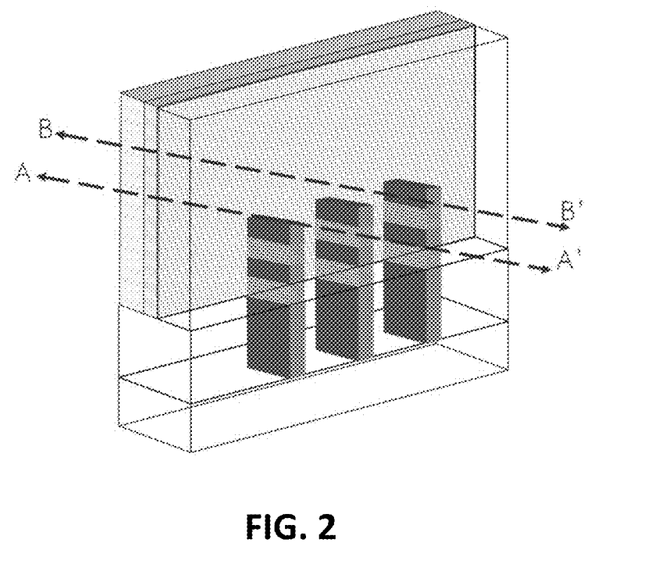
FIG. 2 shows the same structure as FIG. 1. In this structure the cross-sections A-A' and B-B' are indicated which are shown in the following figures.

An example of such a semiconductor structure is schematically illustrated in FIG. 1. It shows a 3D drawing of a semiconductor stack wherein three fins 5 comprising a stack of layers of sacrificial material 4 alternated with layers of nanowire material 3 are provided on a substrate 12. This may be a silicon substrate. In between the fins the shallow trench isolation (STI) 2 is present. The STI may for example comprise a silicon oxide (e.g. $SiO_2$). The dummy gate 7 is covering the stack of layers. The same 3D-drawing is also shown in FIG. 2. The dotted lines in FIG. 2 indicate two cross-sections which are shown in the following figures. A first cross-section is the A-A' cross-section. This cross-section is parallel with a fin and is a cross-section through the fin. A second cross-section is the B-B' cross-section. This cross-section is also parallel with the fin but is a cross-section in between two fins.

Figure 3:
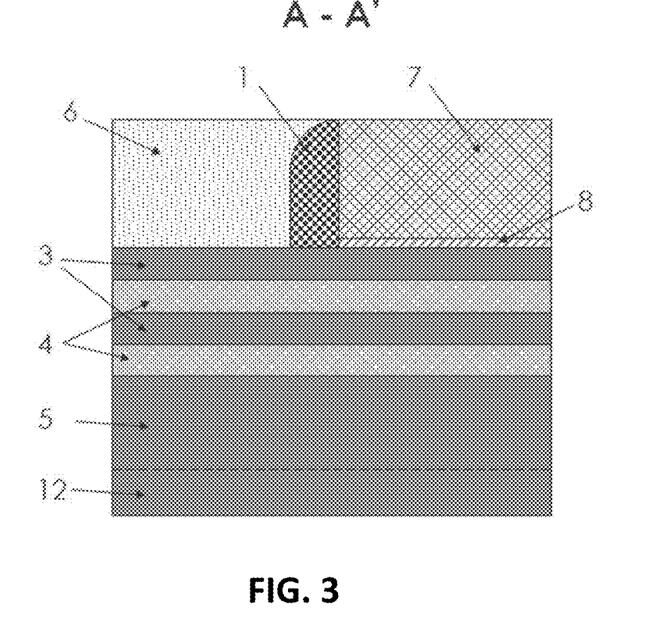
FIG. 3 is a schematic 2D-drawing of the A-A' cross-section of FIG. 2, according to an example embodiment.

FIG. 3 shows the A-A' cross-section. This figure shows a fin 5 on a substrate 12. The dotted line indicates the etch depth of the fin. In this example, the fin is partially made of the silicon substrate. The fin comprises a stack of layers of sacrificial layers 4 alternated with layers of nanowire material 3. On top thereof it shows a dummy gate dielectric 8 and on top thereof the dummy gate 7. Next to the dummy gate dielectric 8 and the dummy gate 7, and on top of the stack of layers, the dummy gate spacer 1 is present, and next to the dummy gate spacer 1 the ILD 6 is present. The dummy gate dielectric 8 may for example comprise a silicon oxide (e.g. $SiO_2$).

Figure 4:
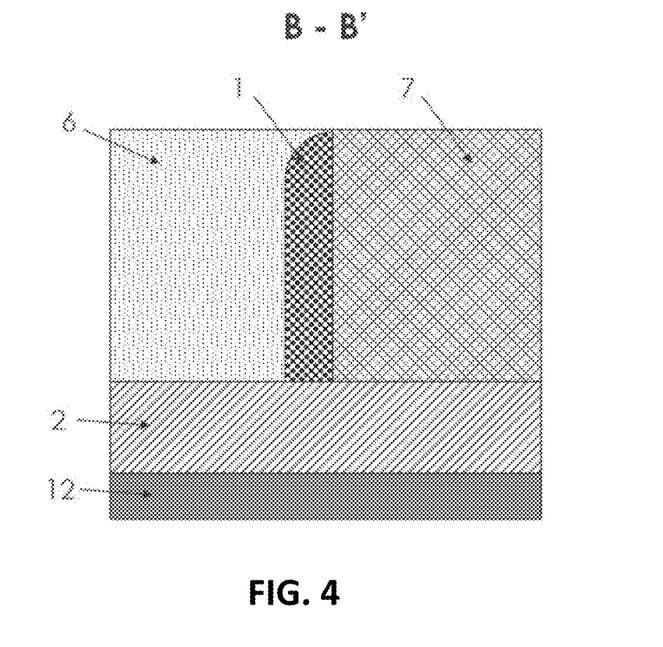
FIG. 4 is a schematic 2D-drawing of the B-B' cross-section of FIG. 2, according to an example embodiment.

FIG. 4 shows the B-B' cross-section. This figure shows the substrate 12, with on top thereof the STI 2, with on top thereof the dummy gate 7, the dummy gate spacer 1 next to the dummy gate 7, and the ILD 6 next to the dummy gate spacer 1. The semiconductor structure shown in FIG. 4 has been treated with an ILD0 CMP.

Figure 5:
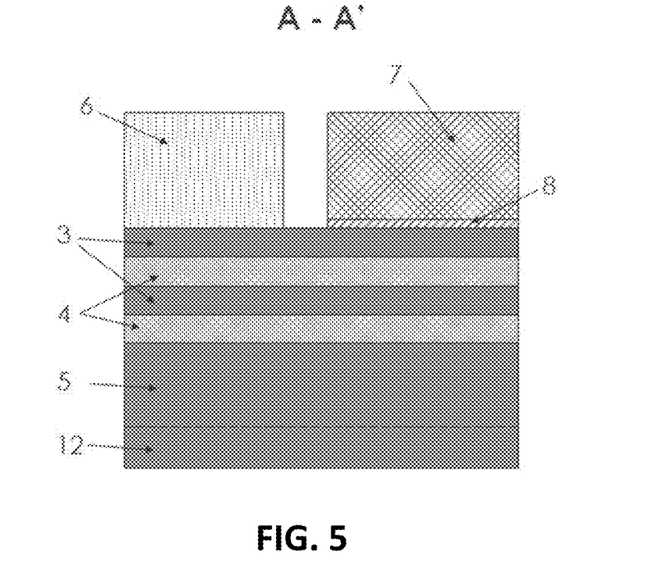
FIG. 5 and FIG. 6 respectively show the A-A' and B-B' cross-sections of the example semiconductor structure after removal of the dummy gate spacer, according to an example embodiment.
Figure 6:
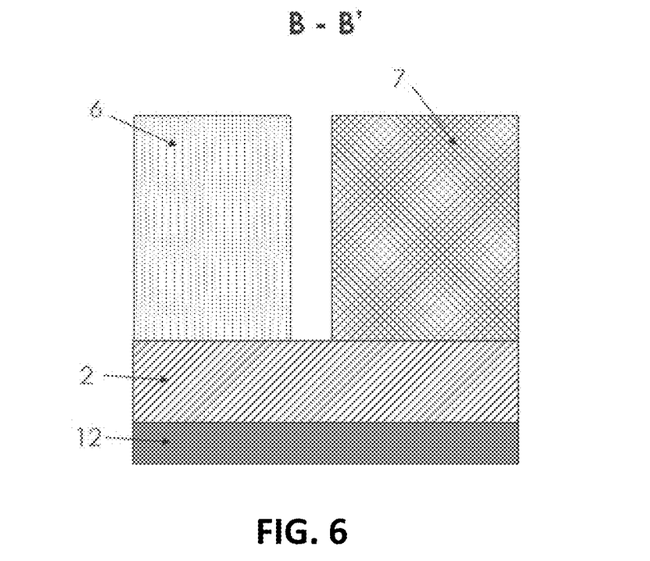

In embodiments of the present disclosure, the method comprises a step 120 for removing the dummy gate spacer 1. Thereby a trench 13 is formed between the ILD 6 and the dummy gate 7. The dummy gate spacer may for example be removed by dry or wet etch. The A-A' and B-B' cross-sections of the exemplary semiconductor structure after removal of the dummy gate spacer are shown in FIG. 5 and FIG. 6.

In embodiments of the present disclosure, the method comprises a step 130 for at least removing the sacrificial material 4 next to the dummy gate, in between the layers of nanowire material. This removing of the sacrificial material may be started from an opening which is formed by the trench 13. This results in a void 14.

Figure 7:
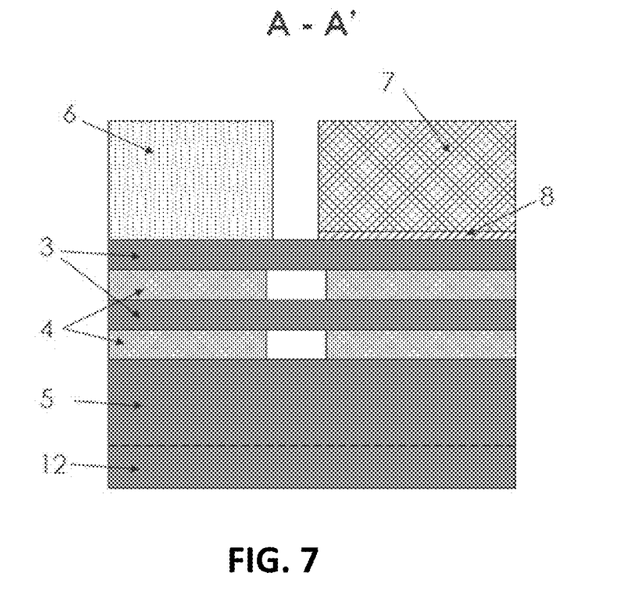
FIG. 7 and FIG. 8 respectively show the A-A' and B-B' cross-sections of the example semiconductor structure after removal of the sacrificial material next to the dummy gate, according to an example embodiment.
Figure 8:
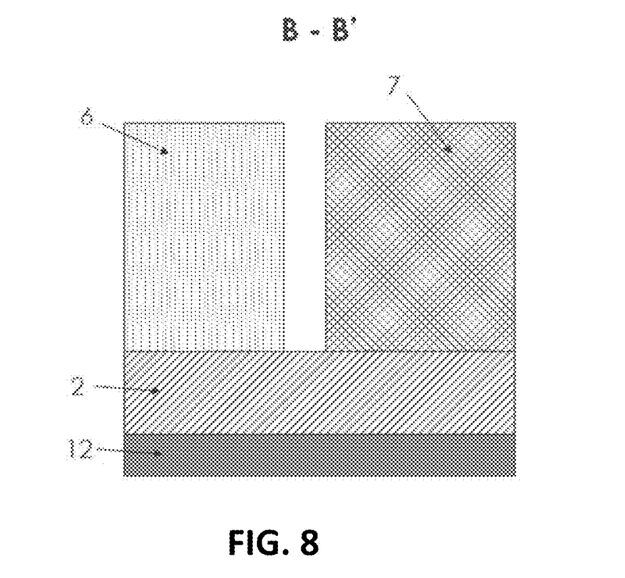

In the example illustrated in FIG. 7 (the A-A' cross-section), the sacrificial material next to the dummy gate is removed starting from this trench. Thereby a void 14 is created. This sacrificial material 4 may for example be SiGe. In this example, the selective removal of the sacrificial material is done. This may be done using dry/wet etch. In FIG. 8, the void 14 is not present because the cross section is a cross-section between two fins.

Figure 9:
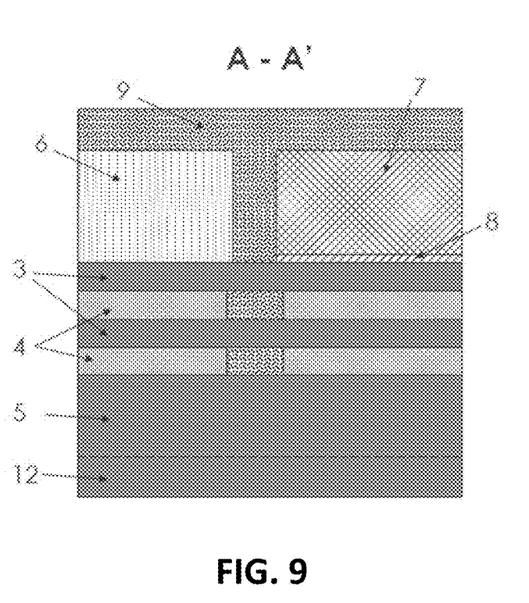
FIG. 9 and FIG. 10 respectively show the A-A' and B-B' cross-sections of the example semiconductor structure after providing the spacer material for forming the internal spacer, according to an example embodiment.
Figure 10:
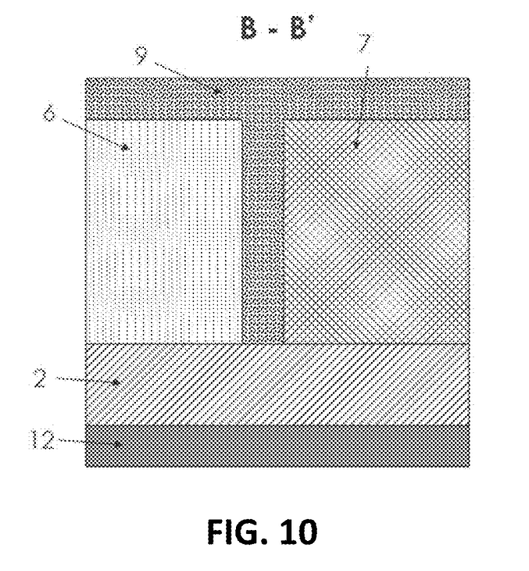

In embodiments of the present disclosure, spacer material is provided within the void to form an internal spacer 15. In embodiments of the present disclosure, providing 140 the spacer material additionally comprises providing 140 spacer material in the trench thereby forming the internal spacer 9 next to the dummy gate 7. FIG. 9 and FIG. 10 respectively show the A-A' and B-B' cross-sections after providing 140 the spacer material for forming the internal spacer 15, 9. The spacer material may be deposited. The spacer material may for example be a silicon nitride (e.g. $Si_3N_4$) or SiC:O. In some embodiments, a carbon content of the SiC:O could be about 15%, however, other percentages of carbon content are possible and contemplated.

Figure 11:
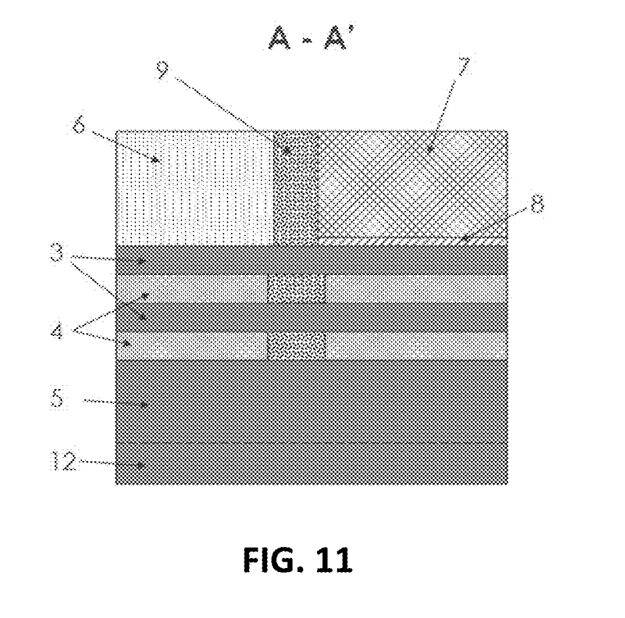
FIG. 11 and FIG. 12 respectively show the A-A' and B-B' cross-sections of the example semiconductor structure after removing the excess spacer material, according to an example embodiment.
Figure 12:
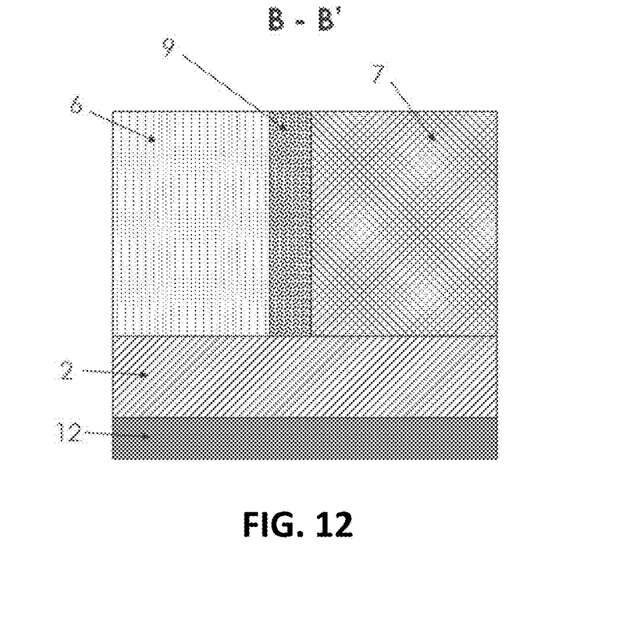

After providing the internal spacer a CMP or etch back step may be done to remove excess material from the internal spacer deposition or filling. Thereby the excess of SiN or SiC:O may be removed. FIG. 11 and FIG. 12 respectively show the A-A' and B-B' cross-sections of the exemplary semiconductor structure after removing the excess spacer material.

Figure 13:
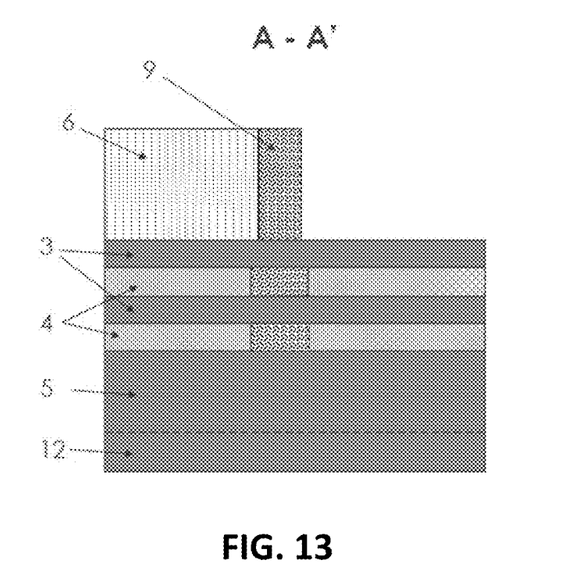
FIG. 13 and FIG. 14 respectively show the A-A' and B-B' cross-sections of the example semiconductor structure after removing the dummy gate, according to an example embodiment.
Figure 14:
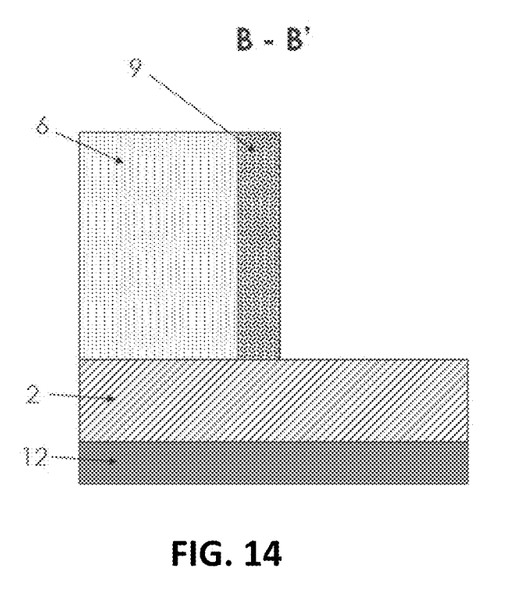

In embodiments of the present disclosure, the dummy gate 7 is removed after providing the internal spacer. If a dummy gate dielectric 8 (e.g. a thin oxide) is present, the dummy gate dielectric is also removed. The dummy gate may, for example, be a poly gate which can be removed by dry/wet etch. FIG. 13 and FIG. 14 respectively show the A-A' and B-B' cross-sections of the exemplary semiconductor structure after removing the dummy gate.

Figure 15:
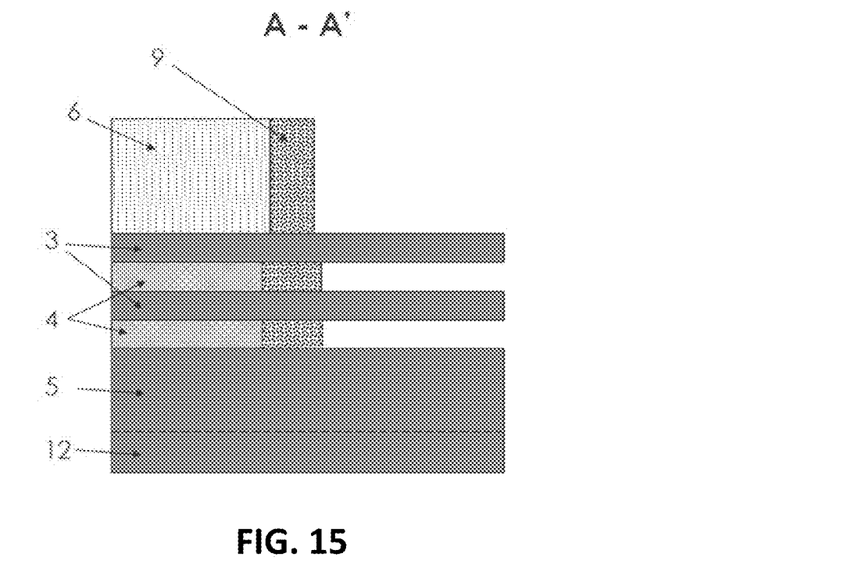
FIG. 15 and FIG. 16 respectively show the A-A' and B-B' cross-sections of the example semiconductor structure after selectively removing the sacrificial material in that part of the fin which was covered by the dummy gate, according to an example embodiment.
Figure 16:
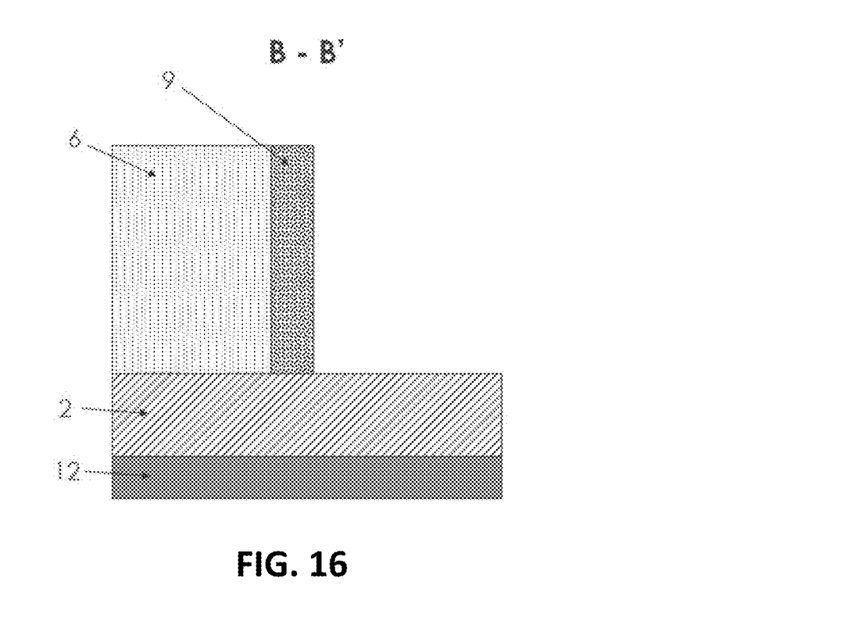

In embodiments of the present disclosure, the sacrificial material in that part of the fin which was covered by the dummy gate is selectively removed. This results in a release of the nanowires. The sacrificial material may, for example, be SiGe and may be removed by etching. FIG. 15 show the A-A' cross-sections of the exemplary semiconductor structure after selectively removing the sacrificial material in that part of the fin which was covered by the dummy gate. FIG. 16 show the B-B' cross-section at the same moment. This cross-section is between the two fins and therefore does not show the stack of layers.

Figure 17:
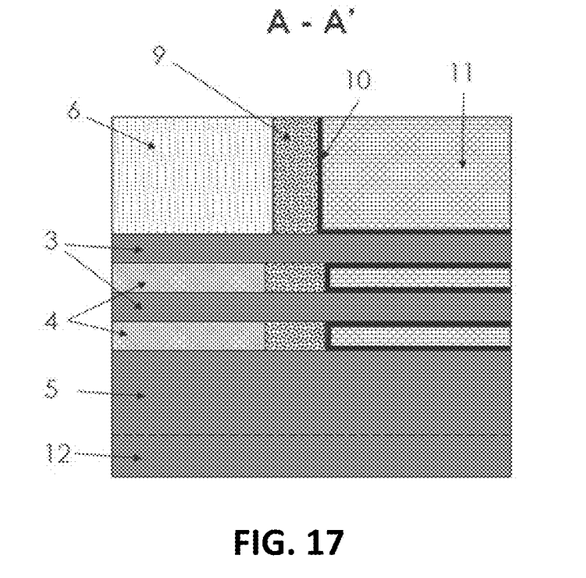
FIG. 17 and FIG. 18 respectively show the A-A' and B-B' cross-sections of the example semiconductor structure after depositing the gate dielectric layer and the metal gate or work function, according to an example embodiment.
Figure 18:
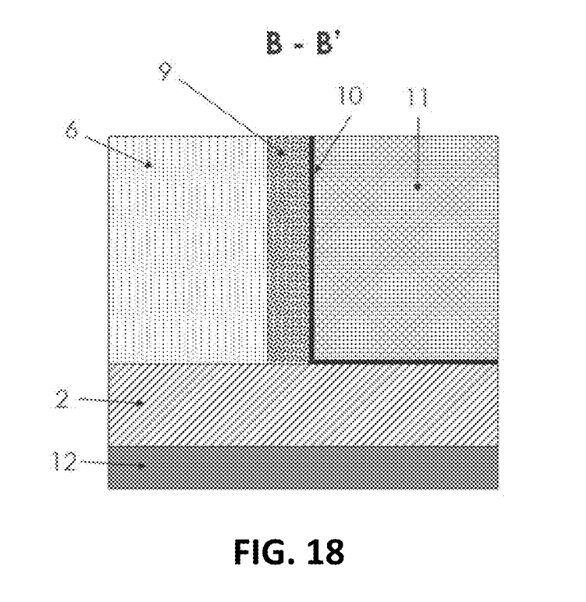

In embodiments of the present disclosure, at block 170, gate dielectric material is deposited around the released nanowires (at the position where the sacrificial material was removed to release the nanowires). This results in a gate dielectric layer 10 around the nanowires. In embodiments of the present disclosure, at block 180, a metal gate material is deposited around the gate dielectric material, thereby forming a gate 11. FIG. 17 and FIG. 18 respectively show the A-A' and B-B' cross-sections of the exemplary semiconductor structure after depositing the gate dielectric layer 10 and the gate 11. The gate dielectric layer 10 may be obtained by atomic layer deposition of $HfO_2$. The gate materials may be workfunction metals, such as TiN, TiC, TaN or TiAl. W filling may be done for the contacting.

In embodiments of the present disclosure, the gate may, for example, have a length of 20 nm and the spacer may have half this size.

FIG. 19 shows a flow chart of an example method in accordance with embodiments of the present disclosure. The method comprises: at block 110, providing a semiconductor structure; at block 120, removing the dummy gate spacer of the semiconductor structure (if a dummy gate spacer was present); at block 130, removing sacrificial material next to the dummy gate in between the layers of nanowire material; at block 140, depositing an internal spacer in the openings formed by removing the sacrificial material (and the dummy gate spacer); at block 150, removing the dummy gate; at block 160, releasing the nanowires at the position which was covered by the dummy gate; at block 170, depositing the gate dielectric around the released nanowires; and, at block 180, depositing gate material around the deposited gate dielectric.

In example embodiments, after removal of the dummy gate spacer selective to the ILD oxide and the dummy gate, the formed empty trench can be used to fill the new internal spacer without an additional lithography step. Therefore, in example embodiments, no additional mask is required and the process is a fully self-aligned process.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method of forming a semiconductor device comprising horizontal nanowires, the method comprising:
   providing a semiconductor structure comprising at least one fin, the at least one fin comprising a stack of layers of a sacrificial material alternated with layers of a nanowire material, the semiconductor structure comprising a dummy gate partly covering the stack of layers of the at least one fin;
   at least partly removing the sacrificial material, in between the layers of the nanowire material, next to the dummy gate thereby forming a void;
   providing spacer material within the void thereby forming an internal spacer;
   removing the dummy gate; and
   selectively removing the sacrificial material in a part of the at least one fin which was covered by the dummy gate, thereby releasing nanowires,
   wherein the sacrificial material, in between the layers of the nanowire material, next to the dummy gate is removed and the internal spacer is provided before removing the dummy gate and the sacrificial material so as to release the nanowires,
   wherein providing the spacer material comprises (i) a first step where a first material is filled bottom up and (ii) a second step comprising a continuous fill with a second material.

2. The method according to claim 1, wherein the semiconductor structure further comprises a dummy gate spacer next to the dummy gate, and an inter-level dielectric (ILD) next to the dummy gate spacer such that the dummy gate spacer is in between the dummy gate and the ILD, the method further comprising:
   before at least partly removing the sacrificial material next to the dummy gate, removing the dummy gate spacer thereby forming a trench,
   wherein the at least partly removing the sacrificial material is started from an opening which is formed by the trench,
   wherein providing the spacer material additionally comprises providing spacer material in the trench thereby forming the internal spacer next to the dummy gate.

3. The method according to claim 1, further comprising:
   depositing gate dielectric material around the nanowires; and
   depositing gate material around the gate dielectric material thereby forming a gate.

4. The method according to claim 3, the method further comprising:
   forming a source at one side of the nanowire material next to the dummy gate or the gate; and
   forming a drain at an opposite end of the nanowire material at an opposite side of the dummy gate or the gate.

5. The method according to claim 1, wherein providing the spacer material comprises filling the spacer material from a bottom portion of the void toward a top portion of the void.

6. The method according to claim 1, wherein providing the spacer material comprises refilling the void and/or a trench with at least one of: a liner, FCVD oxide or spin on material.

7. The method according to claim 1, wherein the at least partly removing the sacrificial material is done by isotropic etching.

8. The method according to claim 1, wherein providing the semiconductor structure comprises depositing a stack of layers on a substrate, the stack of layers comprising layers of sacrificial material alternated with layers of nanowire material and forming at least one fin in the stack of layers.

9. The method according to claim 8, wherein the depositing the stack of layers on the substrate comprises depositing at least two layers of nanowire material.

10. The method according to claim 8, wherein the depositing the stack of layers on the substrate comprises depositing at least three layers of nanowire material.

11. The method according to claim 8, wherein the depositing the stack of layers on the substrate comprises depositing layers of nanowire material, wherein the layers of nanowire material comprise at least one of Silicon, SiGe, Ge, InGaAs, or III-V material.

12. The method according to claim 8, wherein the depositing the stack of layers on the substrate comprises depositing Ge nanowire material layers and SiGe sacrificial material layers.

13. The method according to claim 8, wherein the depositing the stack of layers on the substrate comprises depositing Si nanowire material layers and SiGe sacrificial material layers.

14. The method according to claim 1, wherein providing the spacer material comprises depositing at least one of: silicon nitride, SiC:O, an FCVD oxide, or SiN.

15. A method of forming a semiconductor device, the method comprising:

providing a semiconductor structure comprising at least one fin, the at least one fin comprising a stack of layers of a sacrificial material alternated with layers of a nanowire material, the semiconductor structure comprising a dummy gate partly covering the stack of layers of the at least one fin;

at least partly removing the sacrificial material, in between the layers of the nanowire material, next to the dummy gate so as to form a void;

forming an internal spacer by providing spacer material within the void; and after forming the internal spacer, (i) removing the dummy gate and (ii) selectively removing the sacrificial material in a part of the fin which was covered by the dummy gate, so as to release nanowires, wherein forming the internal spacer comprises (i) a first step where a first material is filled from a bottom portion of the void toward a top portion of the void and (ii) a second step comprising a continuous fill with a second material.

16. The method according to claim 15, further comprising:

depositing gate dielectric material around the nanowires; and depositing gate material around the gate dielectric material thereby forming a gate.

17. The method according to claim 16, further comprising:

forming a source at one side of the nanowire material next to the dummy gate or the gate; and forming a drain at an opposite end of the nanowire material at an opposite side of the dummy gate or the gate.

18. The method according to claim 15, wherein forming the internal spacer comprises filling the spacer material from a bottom portion of the void toward a top portion of the void.

* * * * *